(12) United States Patent
Stainer

(10) Patent No.: US 9,620,187 B2
(45) Date of Patent: Apr. 11, 2017

(54) SELF-REFERENCED MRAM CELL THAT CAN BE READ WITH REDUCED POWER CONSUMPTION

(71) Applicant: Crocus Technology SA, Grenoble (FR)

(72) Inventor: Quentin Stainer, Grenoble (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/772,916

(22) PCT Filed: Feb. 21, 2014

(86) PCT No.: PCT/EP2014/053442
§ 371 (c)(1),
(2) Date: Sep. 4, 2015

(87) PCT Pub. No.: WO2014/135385
PCT Pub. Date: Sep. 12, 2014

(65) Prior Publication Data
US 2016/0012874 A1    Jan. 14, 2016

(30) Foreign Application Priority Data

Mar. 7, 2013 (EP) .................................... 13290046

(51) Int. Cl.
*G11C 11/16* (2006.01)
*H01L 43/08* (2006.01)
*H01L 43/02* (2006.01)

(52) U.S. Cl.
CPC ........ *G11C 11/161* (2013.01); *G11C 11/1673* (2013.01); *G11C 11/1675* (2013.01); *H01L 43/02* (2013.01); *H01L 43/08* (2013.01)

(58) Field of Classification Search
CPC ... G11C 11/161; G11C 11/1673; H01L 43/02; H01L 43/08
See application file for complete search history.

(56) References Cited

U.S. PATENT DOCUMENTS

| | | |
|---|---|---|
| 2003/0189842 A1 | 10/2003 | Deak |
| 2010/0080049 A1 | 4/2010 | Zheng |

(Continued)

FOREIGN PATENT DOCUMENTS

EP    2 276 034 A2    1/2011

OTHER PUBLICATIONS

International Search Report for PCT/EP2014/053442 dated May 16, 2014.

(Continued)

*Primary Examiner* — Tri Hoang
(74) *Attorney, Agent, or Firm* — Pearne & Gordon LLP

(57) ABSTRACT

Self-referenced magnetic random access memory (MRAM) cell including a magnetic tunnel junction including a sense layer; a storage layer having a storage magnetization; a tunnel barrier layer between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature. The sense layer includes a first sense layer having a first sense magnetization, a second sense layer having a second sense magnetization and spacer layer between the first and second sense layers. The MRAM cell can be read with low power consumption.

10 Claims, 4 Drawing Sheets

(56) References Cited

U.S. PATENT DOCUMENTS

| | | | |
|---|---|---|---|
| 2012/0314488 A1 | 12/2012 | Baraji | |
| 2013/0077390 A1* | 3/2013 | Lombard | G11C 11/1673 365/158 |
| 2013/0148419 A1* | 6/2013 | Prejbeanu | G11C 11/1673 365/158 |
| 2013/0163318 A1* | 6/2013 | Prejbeanu | G11C 11/1675 365/158 |
| 2014/0048895 A1* | 2/2014 | Huang | H01L 43/02 257/421 |
| 2014/0111195 A1* | 4/2014 | Kuo | G01R 33/098 324/252 |

OTHER PUBLICATIONS

Wang, et al., "Low-current Blocking Temperature Writing of Double Barrier Magnetic Random Access Memory Cells", Applied Physics Letters, AIP, American Institute of Physics, Melville, Ny, US, vol. 84, No. 6, Feb. 9, 2004, pp. 945-947.

"Coupling Phenomena and Scalability of CoFeB/Ru/CoFeB Sandwiches", Feb. 1, 2006, Retrieved from the internet: URL: http: //www. researchgate.net/profile/Nils Wiese/publication/ 36449143 Coupling phenomena and scalability of CoFeBRuCoFeB sandwiches/file/79e41588f0543e96f3. pdf, retrieved on May 7, 2014.

* cited by examiner

SELF-REFERENCED MRAM CELL THAT CAN BE READ WITH REDUCED POWER CONSUMPTION

FIELD

The present invention concerns a self-referenced magnetic random access memory (MRAM) cell that can be read with reduced power consumption and a method for reading the MRAM cell.

DESCRIPTION OF RELATED ART

A self-referenced MRAM cell typically comprises a magnetic tunnel junction including a storage layer having a storage magnetization that is exchange-coupled with an antiferromagnetic layer such that the storage magnetization can be switched from a first stable direction to another stable direction, a tunnel barrier layer and a sense layer having a sense magnetization that can be varied.

Writing to the self-referenced MRAM cell is usually performed by heating the magnetic tunnel junction to a critical temperature freeing the storage magnetization and switching the storage magnetization by using a write magnetic field. The written self-referenced MRAM cell is read by switching the sense magnetization in two opposed directions and comparing the resistance of the magnetic tunnel junction measured for the two directions of the sense magnetization. The self-referenced MRAM cell is thus characterized by the differential reading mechanism that relies on the magnetization switching of the sense layer.

The storage layer is usually a synthetic antiferromagnetic storage layer comprising two ferromagnetic layers, the magnetization of one of the ferromagnetic layers being coupled antiparallel with the magnetization of the other ferromagnetic layer by a coupling layer sandwiched between the two ferromagnetic layers. The read magnetic field used for switching the sense magnetization depends on the magnetostatic coupling (or dipolar coupling) between the synthetic antiferromagnetic storage layer and the sense layer. The read magnetic field depends further on the magnetocrystalline anisotropy of the sense layer.

The dipolar coupling between the sense and the storage layer can be decreased by reducing the net moment of the synthetic antiferromagnetic storage layer. However, this results in an increase in the write magnetic field for writing the self-referenced MRAM cell.

US2010080049 discloses a method of writing to a multi-bit MRAM memory unit which includes self-detected writing to a multi-bit (i.e., multilevel) thermally assisted MRAM. The self-detected writing increases a reading margin between data state levels and decreases reading margin variability due to cell resistance variation.

US2012314488 discloses a magnetic random access memory (MRAM) cell which includes a storage layer, a sense layer, and a spacer layer between the storage layer and the sense layer. A field line is magnetically coupled to the MRAM cell to induce a magnetic field along a magnetic field axis, and at least one of the storage layer and the sense layer has a magnetic anisotropy axis that is tilted relative to the magnetic field axis. During a write operation, a storage magnetization direction is switchable between m directions to store data corresponding to one of m logic states, with m>2, where at least one of the m directions is aligned relative to the magnetic anisotropy axis, and at least another one of the m directions is aligned relative to the magnetic field axis. During a read operation, a sense magnetization direction is varied, relative to the storage magnetization direction, to determine the data stored by the storage layer.

EP2276034 discloses a magnetic random access memory cell containing a magnetic tunnel junction formed from an insulating layer comprised between a sense layer and a storage layer. There is also disclosed a method for writing and reading the memory cell comprising, during a write operation, switching a magnetization direction of said storage layer to write data to said storage layer and, during a read operation, aligning magnetization direction of said sense layer in a first aligned direction and comparing said write data with said first aligned direction by measuring a first resistance value of said magnetic tunnel junction.

The publication "Low-current blocking temperature writing of double barrier magnetic random access memory cells" of Jiangue Wang, discloses a magnetic random access memory cell architecture where the pinned layer is reversed by heating above a reduced blocking temperature with a current pulse crossing the junction, and cooled under an external applied field, minimizing half-select switching of non-addressed bits. In order to improve Joule heating and increase breakdown voltage, a double barrier structure is used, with a common anti-ferromagnetic layer (60 Å MnIr) two pinned 30 Å CoFe layers, and two free layers incorporating nanooxide structures.

SUMMARY

The present disclosure concerns a self-referenced MRAM cell comprising a magnetic tunnel junction including a sense layer; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature; said sense layer comprising a first sense layer having a first sense magnetization, a second sense layer having a second sense magnetization and a spacer layer between the first and second sense layers.

In an embodiment, the spacer layer can have a thickness such that no direct ferromagnetic coupling occurs between the first and second sense layers.

In another embodiment, the size of the magnetic tunnel junction can be larger than about 100 nm and the spacer layer has a thickness being greater than about 2 nm, but preferably greater than about 2.5 nm. The spacer layer can further have a thickness such that RKKY coupling is minimal.

In yet another embodiment, the size of the magnetic tunnel junction can be smaller than about 100 nm and the spacer layer can have a thickness being comprised between 1 nm and 2 nm and preferably about 1.5 nm.

In yet another embodiment, the first and second sense layers can allow for scissoring switching of the first and second sense magnetization.

The disclosure also pertains to a method for reading the self-referenced MRAM cell, comprising applying a first read magnetic field for switching the first and second sense magnetizations in a first direction;

comparing the first direction of the switched first and second sense magnetizations with the storage magnetization by passing a read current though the magnetic tunnel junction such as to measure a first resistance value of the magnetic tunnel junction;

applying a second read magnetic field for switching the first and second sense magnetizations in a second direction opposed to the first direction; and comparing the second direction of the switched first and second sense magnetizations with the storage magnetization by passing the read current though the magnetic tunnel junction such as to measure a second resistance value of the magnetic tunnel junction.

An advantage of the arrangement of the first and second sense magnetisations is that the apparent magnetocrystalline anisotropy of the sense layer can be fine-tuned as far as to cancel it. The MRAM cell can be read with low power consumption.

BRIEF DESCRIPTION OF THE DRAWINGS

The invention will be better understood with the aid of the description of an embodiment given by way of example and illustrated by the figures, in which:

FIGS. 4a-c represents the sense layer with a first and second sense magnetization being switched by applying a read magnetic field, according to an embodiment;

FIGS. 5a-c represents the sense layer with a first and second sense magnetization being switched by applying a read magnetic field, according to another embodiment.

DETAILED DESCRIPTION OF POSSIBLE EMBODIMENTS

Figure 1:
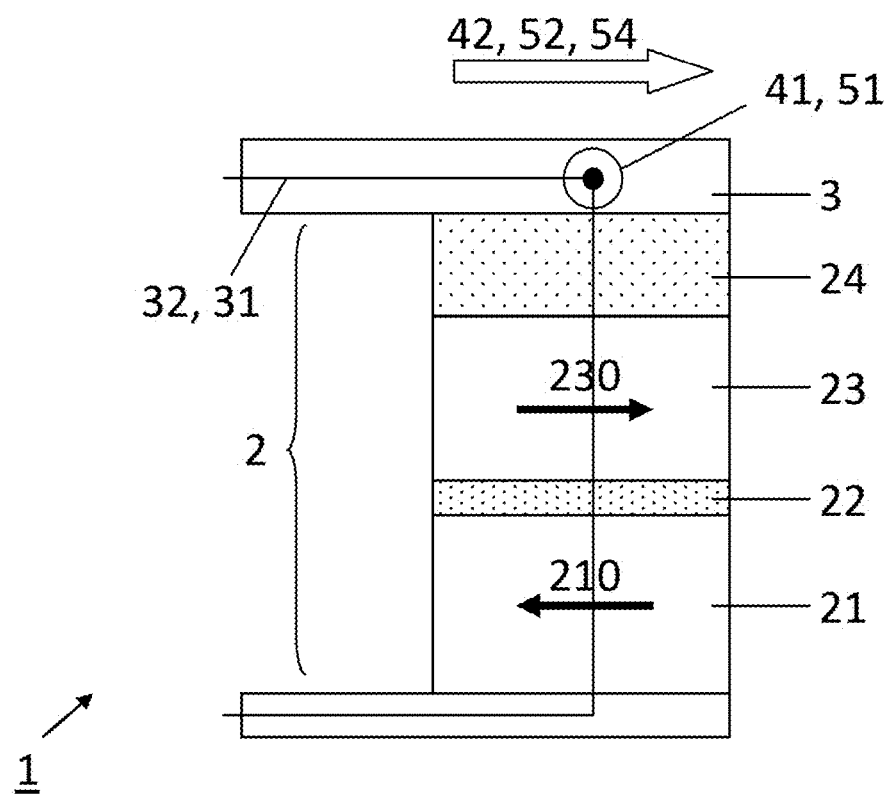
FIG. 1 illustrates a self-referenced MRAM cell comprising a magnetic tunnel junction with a sense layer, according to an embodiment.

FIG. 1 illustrates a MRAM cell 1 according to an embodiment. The MRAM cell 1 comprises a magnetic tunnel junction 2 comprising a storage layer 23 having a storage magnetization 230, a sense layer 21 having a sense magnetization 210 and a barrier layer 22 between the storage and sense layer 23, 21. The magnetic tunnel junction 2 further comprises an antiferromagnetic layer 24 having a blocking temperature and exchange-coupling the storage layer 23 such that the storage magnetization 230 can be freely varied at a write temperature, at or above the blocking temperature, and is pinned at a read temperature, below the blocking temperature. The blocking temperature is typically between 150° C. to 200°.

The MRAM cell 1 further comprises a current line 3 in electrical communication with one end of the magnetic tunnel junction 2. A write magnetic field 42 can be applied by passing a write current 41 in a field line that can be the current line 3. Alternatively, the field line can be another field line (not represented) located above the upper current line 3 or at the other end of the magnetic tunnel junction 2.

In an embodiment, a method for writing to the MRAM cell 1 comprises:

heating the magnetic tunnel junction 2 to the write temperature;

applying the write magnetic field 42 such as to switch the storage magnetization 230, such as to write a data state in the storage layer 23; and cooling the magnetic tunnel junction to the read temperature such as to pin the storage magnetization 230.

Heating the magnetic tunnel junction 2 can be performed by passing a heating current 32 in the magnetic tunnel junction 2 via the current line 3.

The sense magnetization 210 can be freely varied. A self-referenced read operation of the MRAM cell 1 can comprise:

applying a first read magnetic field 52 for switching the sense magnetization 210 in a first direction, comparing the first direction of the sense magnetization 210 with the written storage magnetization 230 by passing a sense current 31 though the magnetic tunnel junction 2 such as to measure a first resistance value $R_1$ of the magnetic tunnel junction 2;

applying a second read magnetic field 54 for switching the sense magnetization 210 in a second direction opposed to the first direction; and comparing the second direction of the sense magnetization 210 with the written storage magnetization 230 by passing the sense current 31 though the magnetic tunnel junction 2 such as to measure a second resistance value $R_2$ of the magnetic tunnel junction 2.

In particular, the voltage measured across the magnetic tunnel junction 2 yields a corresponding first and second resistance values $R_1$ and $R_2$ of the magnetic tunnel junction 2. The first and second read magnetic field 52, 54 can be applied by passing a read field current 51 in the current line 3, wherein the read field current 51 has a first polarity and a second polarity opposed to the first polarity, respectively. The first resistance value $R_1$ can be compared with the second resistance value $R_2$ such as to determine the data written in the MRAM cell 1.

Figure 2A:
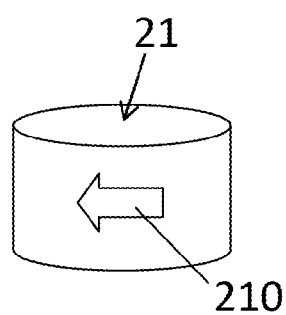
FIGS. 2a-c and 3a-c illustrate the sense layer with a sense magnetization being switched by applying a read magnetic field, according to an embodiment.
Figure 2B:
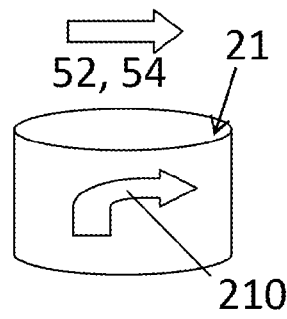
Figure 2C:
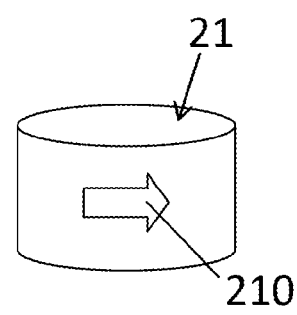
Figure 3A:
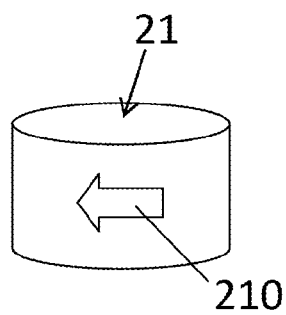
Figure 3B:
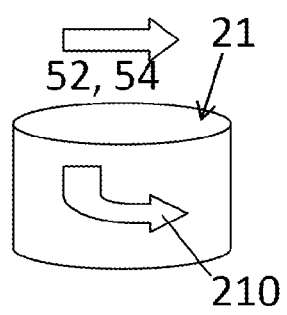
Figure 3C:
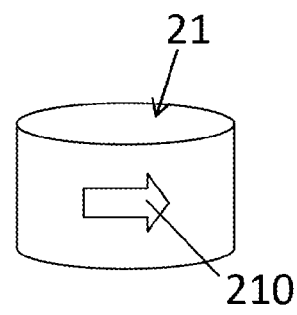

FIGS. 2 and 3 illustrate the sense layer with the sense magnetization 210 being switched with the first or second direction by applying the first or second read magnetic field 52, 54. More particularly, the sense magnetization 210 is shown prior (FIGS. 2a and 3a), during (FIGS. 2b and 3b), and after (FIGS. 2c and 3c) the switching. The sense magnetization 210 is switched either clockwise (FIG. 2b) or counterclockwise (FIG. 3b).

Figure 4B:
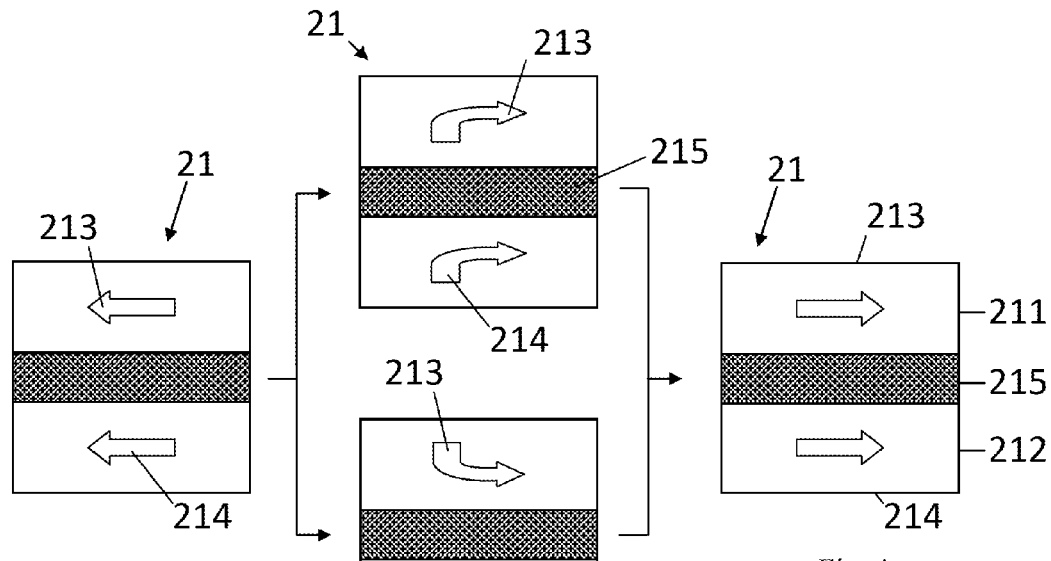
Figure 4B:
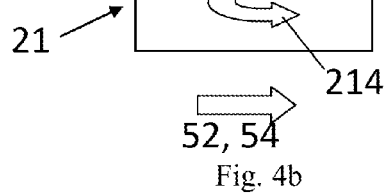

In an embodiment represented in FIG. 4, the sense layer 21 comprises a first sense layer 211 having a first sense magnetization 213, a second sense layer 212 having a second sense magnetization 214 and spacer layer 215 between the first and second sense layers 211, 212. The first and second sense layers 211, 212 can be made of a material such as, for example, cobalt iron (CoFe) or cobalt iron boron (CoFeB). The spacer layer 215 can be made of a metal comprising at least one of Ta, Ru or Cu. Such arrangement is usually used for forming synthetic storage layers, wherein the dimensions (e.g., thickness) of the spacer layer is selected to cause the first and second storage layers to be strongly coupled, via RKKY interaction, so that the first storage magnetization is oriented anti-parallel with the second magnetization.

In the present embodiment, the spacer layer 215 has a thickness such that no direct ferromagnetic coupling occurs between the first and second sense layers 211, 212. For example, the spacer layer 215 has a thickness above 2 nm, preferably above 2.5 nm. The RKKY interaction varies in a periodic fashion with the thickness of the spacer layer 215. Alternatively, the spacer layer 215 can thus have a thickness corresponding to a minimal RKKY coupling. In the case the size of the magnetic tunnel junction 2 is smaller than about 100 nm the dipolar coupling can become important such that the two sense layers 211, 212 behave as synthetic antiferromagnetic layers, i.e., become coupled antiparallel. In this case, the thickness of the spacer layer 215 can be adjusted such as to obtain a parallel coupling between the first and second sense layers 211, 212. This parallel coupling will counterbalance the dipolar antiparallel coupling between the storage layer 23 and the sense layers 211, 212 and the two sense layers 211, 212 will behave as if there was no strong magnetic coupling between them. In particular, for the magnetic tunnel junction 2 having a size being smaller than about 100 nm the thickness of the spacer layer 215 can be adjusted to be between 1 nm and 2 nm and preferably about 1.5 nm.

The spacer layer 215 having a thickness above 2 nm and preferably above 2.5 nm is such that the weak dipolar and/or RKKY coupling is below the magnetic coupling required for antiferromagnetic SAF coupling between the first and second sense layers 211, 212 and facilitates the scissoring switching of the first and second sense magnetization 213, 214. In that configuration of sense layer 21, switching of the first and second sense magnetization 213, 214 will thus occur through a rotation of the first and second sense magnetizations 213, 214, clockwise or counter-clockwise.

Figure 5B:
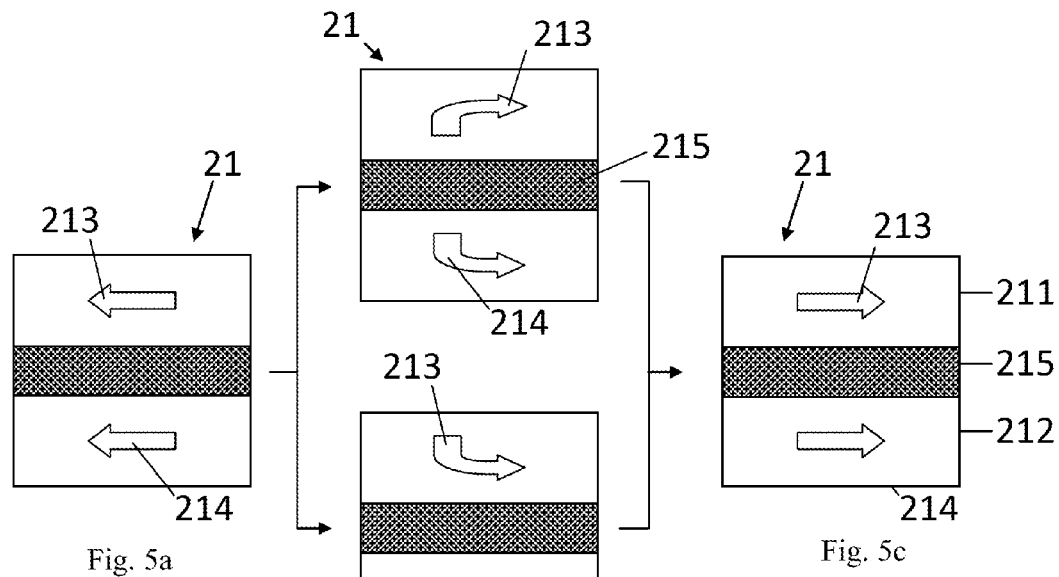
Figure 5B:
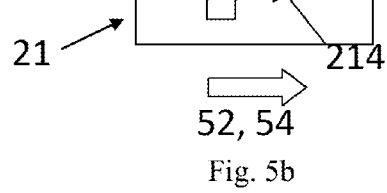
Figure 6:
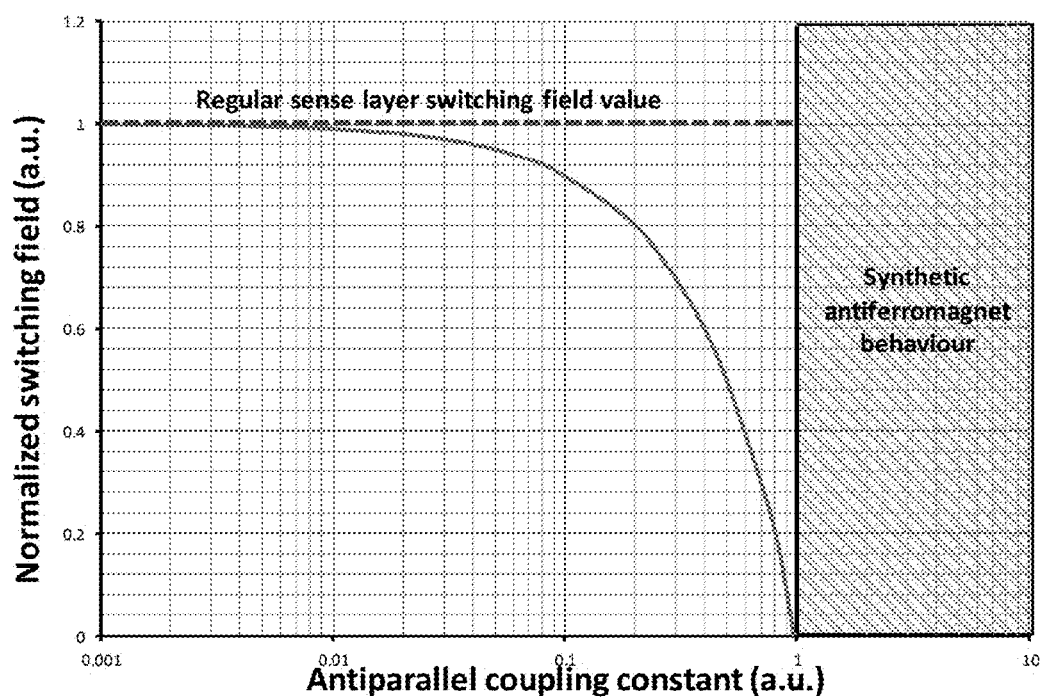
FIG. 6 shows a graph plotting an antiparallel coupling constant in arbitrary units against the read magnetic field for the sense layer configuration of FIGS. 5a-c.

FIG. 6 represents a graph plotting an antiparallel coupling constant in arbitrary units against the read magnetic field (normalized switching field), also in arbitrary units, for the sense layer configuration of FIGS. 4 and 5. The graph shows that, for the antiparallel coupling constant being above about 0.01, the sense magnetization 213, 214 can be switched using a smaller read magnetic field that the read magnetic field used in a single sense layer 21 such as the one of FIGS. 1 and 2. For a value of the antiparallel coupling constant above 1, the first and second sense magnetization 213, 214 behave as a synthetic antiferromagnet.

In a preferred embodiment, the spacer layer 215 is arranged such that antiparallel constant is comprised between 0.01 and 1.

Switching of the first and second sense magnetization 213, 214 can be in a parallel configuration such as shown in FIG. 4. In this configuration, the first and second sense magnetizations 213, 214 are both rotated either clockwise or counter-clockwise (or switched in a parallel configuration). Such switching is energetically equivalent to the switching of the single sense magnetization as shown in FIG. 3.

Alternatively, switching of the first and second sense magnetization 213, 214 can be performed in a symmetric scissoring configuration such as shown in FIG. 5. In this configuration, the first sense magnetizations 213 is rotated clockwise and the second sense magnetizations 214 is rotated counter-clockwise. Such switching is energetically more favorable to the switching of the single sense magnetization as shown in FIG. 3 and thus, the switching of the parallel configuration of FIG. 4.

An advantage of the arrangement of the first and second sense magnetisations 213, 214 as disclosed herein is that the apparent magnetocrystalline anisotropy of the sense layer 21 can be fine-tuned as far as to cancel it. This can be achieved without having to adapt or change the composition of the sense layers 211, 212, but can be achieved uniquely by using the two sense layer arrangement.

Low amplitude of the read field current 51 can be used for switching the first and second sense magnetizations 213, 214 during the read operation without the need of selecting material for the sense layers 211, 212 that could be detrimental to both the TMR performances of the MRAM cell 1 and to the process quality.

REFERENCE NUMBERS AND SYMBOLS 1 magnetic random access memory (MRAM) cell
2 magnetic tunnel junction
21 sense layer
210 sense magnetization
211 first sense layer
212 second sense layer
213 first sense magnetization
214 second sense magnetization
215 spacer layer
23 storage layer
230 storage magnetization
3 current line
31 sense current
32 heating current
41 write current
42 write magnetic field
51 read field current
52 first read magnetic field
54 second read magnetic field

What is claimed is:

1. Self-referenced magnetic random access memory (MRAM) cell comprising a magnetic tunnel junction including a sense layer; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature;

said sense layer comprising a first sense layer having a first sense magnetization, a second sense layer having a second sense magnetization and spacer layer between the first and second sense layers, the spacer layer being a metal layer which introduces a Ruderman-Kittel-Kasuya-Yosida (RKKY) coupling, and wherein either, the dimension of the magnetic tunnel junction along the first and second sense magnetization, is larger than 100 nm and the spacer layer has a thickness greater than 2 nm such that said RKKY coupling is below the magnetic coupling required for antiferromagnetic SAF coupling between the first and second sense layers; or, the dimension of the magnetic tunnel junction along the first and second sense magnetization, is smaller than 100 nm and the spacer layer has a thickness between 1 nm and 2 nm such that RKKY coupling is a parallel coupling counterbalancing dipolar coupling between the first and second sense layer.

2. MRAM cell according to claim 1, wherein the spacer layer has a thickness such that no direct ferromagnetic coupling occurs between the first and second sense layers.

3. MRAM cell according to claim 1, wherein the spacer layer has a thickness such that RKKY coupling corresponds to a minimum in the periodic variation of the RKKY interaction with the thickness of the spacer layer.

4. RAM cell according to claim 1, wherein the first and second sense layers allows for scissoring switching of the first and second sense magnetization.

5. RAM cell according to claim 4, wherein the spacer layer is arranged such that antiparallel constant is comprised between 0.01 and 1.

6. RAM cell according to claim 4, wherein the spacer layer is arranged such that said scissoring switching comprises a symmetric configuration.

7. RAM cell according to claim 6, wherein said scissoring switching occurs through a rotation of the first and second sense magnetization, clockwise or counter-clockwise.

8. Method for reading a self-referenced magnetic random access memory (MRAM) cell comprising a magnetic tunnel junction including a sense layer; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature; said sense layer comprising a first sense layer having a first sense magnetization, a second sense layer having a second sense magnetization and spacer layer between the first and second sense layers, the spacer layer being a metal layer which introduces a Ruderman-Kittel-Kasuya-Yosida (RKKY) coupling, and wherein either, the dimension of the magnetic tunnel junction along the first and second sense magnetization, is larger than 100 nm and the spacer layer has a thickness greater than 2 nm such that said RKKY coupling is below the magnetic coupling required for antiferromagnetic SAF coupling between the first and second sense layers; or the dimension of the magnetic tunnel junction along the first and second sense magnetization, is smaller than 100 nm and the spacer layer has a thickness between 1 nm and 2 nm such that RKKY coupling is a parallel coupling counterbalancing dipolar coupling between the first and second sense layer; the method comprising
  applying a first read magnetic field for switching the first and second sense magnetizations in a first direction;
  comparing the first direction of the switched first and second sense magnetizations with the storage magnetization by passing a sense current though the magnetic tunnel junction such as to measure a first resistance value of the magnetic tunnel junction;
  applying a second read magnetic field for switching the first and second sense magnetizations in a second direction opposed to the first direction; and
  comparing the second direction of the switched first and second sense magnetizations with the storage magnetization by passing the sense current though the magnetic tunnel junction such as to measure a second resistance value of the magnetic tunnel junction.

9. Method according to claim 8, wherein said switching of the first and second sense magnetization comprises scissoring switching in a symmetric configuration, whereby the first and second sense magnetization are rotated in opposite directions.

10. Method according to claim 8, wherein said switching of the first and second sense magnetization occurs through a rotation of the first and second sense magnetizations, clockwise or counter-clockwise.

* * * * *